United States Patent
Dong et al.

(10) Patent No.: US 12,211,810 B2
(45) Date of Patent: Jan. 28, 2025

(54) DRIVE CHIP AND DISPLAY PANEL

(71) Applicant: WUHAN CHINA STAR OPTOELECTRONICS TECHNOLOGY CO., LTD., Hubei (CN)

(72) Inventors: Shuya Dong, Hubei (CN); Haosen Ge, Hubei (CN); Yong Tian, Hubei (CN); Bo Liu, Hubei (CN)

(73) Assignee: WUHAN CHINA STAR OPTOELECTRONICS TECHNOLOGY CO., LTD., Hube (CN)

( * ) Notice: Subject to any disclaimer, the term of this patent is extended or adjusted under 35 U.S.C. 154(b) by 0 days.

(21) Appl. No.: 17/613,003

(22) PCT Filed: Oct. 20, 2021

(86) PCT No.: PCT/CN2021/125013
§ 371 (c)(1),
(2) Date: Nov. 19, 2021

(87) PCT Pub. No.: WO2023/050494
PCT Pub. Date: Apr. 6, 2023

(65) Prior Publication Data
US 2024/0038700 A1 Feb. 1, 2024

(30) Foreign Application Priority Data
Sep. 30, 2021 (CN) .......................... 202111164185.6

(51) Int. Cl.
| H01L 23/00 | (2006.01) |
| G02F 1/1345 | (2006.01) |
| H01L 25/18 | (2023.01) |
| H10K 59/90 | (2023.01) |

(52) U.S. Cl.
CPC .............. *H01L 24/06* (2013.01); *H01L 24/05* (2013.01); *G02F 1/13452* (2013.01);
(Continued)

(58) Field of Classification Search
None
See application file for complete search history.

(56) References Cited

U.S. PATENT DOCUMENTS

2015/0279792 A1* 10/2015 Matsui ................ G02F 1/13452
257/737
2017/0221934 A1 8/2017 Iwai et al.
(Continued)

FOREIGN PATENT DOCUMENTS

| CN | 1629917 A | 6/2005 |
| CN | 101285942 A | 10/2008 |

(Continued)

OTHER PUBLICATIONS

Chinese Office Action issued in corresponding Chinese Patent Application No. 202111164185.6 dated Apr. 14, 2022, pp. 1-11.
(Continued)

*Primary Examiner* — Hung K Vu
(74) *Attorney, Agent, or Firm* — PV IP PC; Wei Te Chung

(57) ABSTRACT

The present application discloses a drive chip and a display panel. The drive chip includes a first area and a second area. The drive chip includes a substrate and drive pins. The density of the pins located in the first area is lower than the density of the pins located in the second area. The pins located in the second area includes first drive pins and second drive pins. The distance between the substrate and a face of the first drive pins away from the substrate is greater than the distance between the substrate and a face of the
(Continued)

second drive pins away from the substrate. The occurrence of poor electric conduction is avoided.

16 Claims, 6 Drawing Sheets

(52) U.S. Cl.
CPC .............. *H01L 24/32* (2013.01); *H01L 25/18* (2013.01); *H01L 2224/05553* (2013.01); *H01L 2224/0603* (2013.01); *H01L 2224/06133* (2013.01); *H01L 2224/06134* (2013.01); *H01L 2224/06153* (2013.01); *H01L 2224/06154* (2013.01); *H01L 2224/32145* (2013.01); *H01L 2224/32221* (2013.01); *H01L 2924/1426* (2013.01); *H10K 59/90* (2023.02)

(56) References Cited

U.S. PATENT DOCUMENTS

| | | |
|---|---|---|
| 2017/0256583 A1 | 9/2017 | Choi et al. |
| 2019/0165078 A1 | 5/2019 | Tsuruoka |

FOREIGN PATENT DOCUMENTS

| | | |
|---|---|---|
| CN | 104704621 A | 6/2015 |
| CN | 107749239 A | 3/2018 |
| CN | 109036155 A | 12/2018 |
| CN | 110473788 A | 11/2019 |
| CN | 110579917 A | 12/2019 |
| CN | 111180464 A | 5/2020 |
| CN | 111383554 A | 7/2020 |
| CN | 111883039 A | 11/2020 |
| CN | 112037649 A | 12/2020 |
| CN | 113362716 A | 9/2021 |
| JP | 2004247534 A | 9/2004 |
| TW | 201644340 A | 12/2016 |
| WO | 2020019428 A1 | 1/2020 |

OTHER PUBLICATIONS

International Search Report in International application No. PCT/CN2021/125013, mailed on Jun. 24, 2022.
Written Opinion of the International Searching Authority in International application No. PCT/CN2021/125013, mailed on Jun. 24, 2022.

\* cited by examiner

DRIVE CHIP AND DISPLAY PANEL

FIELD OF THE DISCLOSURE

The present application relates to display technologies, and more particularly to a drive chip and a display device.

DESCRIPTION OF RELATED ARTS

In order to overcome the drawback of a large lower bezel of a chip-on-glass (COG, the chip is directly bound to glass) display panel, improvements on a drive chip to realize an extreme narrow lower bezel of the display panel specifically are that drive pins for transmitting display signals are placed at a side of the drive chip and no drive pins are put in other areas. However, the unequal distribution of the drive pins on the driving chip using this design will result in unbalanced support to the drive chip. When the drive chip is bonded to the display panel, a "seesaw" effect occurs, and part of the drive pins are lifted up, thereby causing poor electrical conduction of conductive particles between the drive pins and the display panel. The drive pins cannot be bonded to the pads of the display panel. This causes a decrease of performance of the display panel, and even the display panel cannot work properly.

SUMMARY

Technical Problems

Embodiments of the present application provide a drive chip and a display panel, for solving the technical problem, in which a "seesaw" effect occurs when bonding an existing drive chip to a display panel, causing part of drive pins to lift up to be unable to be bonded to the display panel.

Technical Solutions

To solve above problems, the technical solutions provide in the present application are described below.

The present application provides a drive chip. The drive chip including a first area and a second area;
   the drive chip further including a substrate and pins disposed on the substrate, in which a density of the pins located in the first area is lower than a density of the pins located in the second area, the pins located in the second area includes first drive pins and second drive pins, and the first drive pins are located at a side of the second area away from the first area;
   wherein a distance between the substrate and a face of the first drive pins away from the substrate is greater than a distance between the substrate and a face of the second drive pins away from the substrate.

According to the drive chip provided in the present application, the first area at least includes an empty area, the second area includes a first sub area and a second sub area arranged along a first direction, the first sub area is located between the first area and the second sub area;
   the first drive pins are located in the second sub area, the second drive pins are at least located in the first sub area; wherein, the first direction is a direction from the first area to the second area, a second direction is perpendicular to the first direction.

According to the drive chip provided in the present application, the first area further includes a dummy pin area, a plurality of dummy pins are disposed in the dummy pin area; the empty area includes two sub empty areas, the two sub empty areas are located at two opposite ends of the dummy pin area, respectively, the two sub empty areas and the dummy pin area are arranged along the second direction;
   the second sub area includes a central pin area and two peripheral pin areas that are arranged along the second direction, the two peripheral pin areas are located at two opposite sides of the central pin area, respectively, the first drive pins are located in the peripheral pin areas, the second drive pins are located in the first sub area and the central pin area.

According to the drive chip provided in the present application, the first drive pins in each of the peripheral pin areas are arranged in a single row, the distance between the substrate and the face of the first drive pins away from the substrate increases along a direction from a location close to the central pin area to a location away from the central pin area.

According to the drive chip provided in the present application, each of the peripheral pin areas includes a first peripheral pin area, the first drive pins in the first peripheral pin area are arranged in at least two rows, each row of the first drive pins includes at least two first drive pins disposed in parallel;
   the distance between the substrate and the face of the first drive pins in the first peripheral pin area away from the substrate increases along the first direction.

According to the drive chip provided in the present application, the distance between the substrate and the face of the first drive pins in the first peripheral pin area away from the substrate increases along a direction from a location close to the central pin area to a location away from the central pin area.

According to the drive chip provided in the present application, each of the peripheral pin areas further includes a second peripheral pin area, the second peripheral pin area is located between the first peripheral pin area and the central pin area, the first drive pins in the second peripheral pin area are arranged in a single row along the second direction;
   the distance between the substrate and the face of the first drive pins in the second peripheral pin area away from the substrate increases along a direction from a location close to the central pin area to a location away from the central pin area.

According to the drive chip provided in the present application, each of the peripheral pin areas is inclined with respect to the central pin area, each of the peripheral pin areas includes a first end connecting to the central pin area and a second end away from the central pin area, the distance from the first end to the first area is less than the distance from the second end to the first area;
   an included angle on the second direction formed between connection lines between the first ends and the second ends of the peripheral pin areas is an obtuse angle.

According to the drive chip provided in the present application, the empty area occupies the whole first area, the first drive pins are located in the whole second sub area, the second drive pins are located in the first sub area.

According to the drive chip provided in the present application, the empty area is the whole first area, the second sub area includes a central pin area and two peripheral pin areas that are arranged along the second direction, the two peripheral pin areas are located at two opposite sides of the central pin area, respectively, the first drive pins are located in the peripheral pin areas, the second drive pins are located in the first sub area and the central pin area;

each of the peripheral pin areas is inclined with respect to the central pin area, each of the peripheral pin areas includes a first end connecting to the central pin area and a second end away from the central pin area, the distance from the first end to the first area is less than the distance from the second end to the first area; an included angle on the second direction formed between connection lines between the first ends and the second ends of the peripheral pin areas is an obtuse angle.

According to the drive chip provided in the present application, the first drive pins in each of the peripheral pin areas are arranged from the first end to the second end in a single row, the distance between the substrate and the face of the first drive pins away from the substrate increases along a direction from a location close to the central pin area to a location away from the central pin area.

According to the drive chip provided in the present application, the first drive pins in each of the peripheral pin areas are arranged in at least two rows, each row of the first drive pins includes at least two first drive pins disposed in parallel;

the distance between the substrate and the face of the first drive pins in the peripheral pin areas away from the substrate increases along the first direction.

According to the drive chip provided in the present application, the distance between the substrate and the face of the first drive pins in each row of the first drive pins in the peripheral pin areas away from the substrate increases along a direction from a location close to the central pin area to a location away from the central pin area.

According to the drive chip provided in the present application, a thickness of the first drive pins is greater than a thickness of the second drive pins.

According to the drive chip provided in the present application, a difference between the thickness of the first drive pins and the thickness of the second drive pins is greater than or equal to 0.1 micrometer.

The present application provides a display panel, including a display panel body and a drive chip, wherein the drive chip includes a first area and a second area, the drive chip further includes a substrate and pins disposed on the substrate, a density of the pins located in the first area is lower than a density of the pins located in the second area, the pins located in the second area includes first drive pins and second drive pins, and the first drive pins are located at a side of the second area away from the first area; wherein a distance between the substrate and a face of the first drive pins away from the substrate is greater than a distance between the substrate and a face of the second drive pins away from the substrate;

the display panel body includes a display area and a bonding area located at a side of the display area, the drive chip is disposed in the bonding area; the bonding area includes a plurality of first bonding pads and a plurality of second bonding pads, the first bonding pads are electrically connected to the first drive pins, the second bonding pads are electrically connected to the second drive pins.

According to the drive chip provided in the present application, the first area at least includes an empty area, the second area includes a first sub area and a second sub area arranged along a first direction, the first sub area is located between the first area and the second sub area;

the first drive pins are located in the second sub area, the second drive pins are at least located in the first sub area; wherein, the first direction is a direction from the first area to the second area, a second direction is perpendicular to the first direction.

According to the drive chip provided in the present application, the first area further includes a dummy pin area, a plurality of dummy pins are disposed in the dummy pin area; the empty area includes two sub empty areas, the two sub empty areas are located at two opposite ends of the dummy pin area, respectively, the two sub empty areas and the dummy pin area are arranged along the second direction;

the second sub area includes a central pin area and two peripheral pin areas that are arranged along the second direction, the two peripheral pin areas are located at two opposite sides of the central pin area, respectively, the first drive pins are located in the peripheral pin areas, the second drive pins are located in the first sub area and the central pin area.

According to the drive chip provided in the present application, the first drive pins in each of the peripheral pin areas are arranged in a single row, the distance between the substrate and the face of the first drive pins away from the substrate increases along a direction from a location close to the central pin area to a location away from the central pin area.

The present invention provides a display panel, including:
a display panel body, including a display area and a bonding area located at a side of the display area; and
a drive chip, located in the bonding area, including a substrate, and first drive pins and second drive pins disposed on the substrate, the first drive pins and the second drive pins are electrically connected to the display panel body;
wherein the drive chip is in a curled-up state, a distance between the substrate and a face of the first drive pins away from the substrate is greater than a distance between the substrate and a face of the second drive pins away from the substrate.

Beneficial Effects

The beneficial effects are described as follows. In the drive chip and the display panel provided in the present application, the distance between the substrate and the face of the pins on the drive chip away from the substrate is designed in a differentiated manner. The distance between the substrate and the face of the lifted-up first drive pins away from the substrate is greater than the distance between the substrate and the face of the non-lifted-up second drive pins away from the substrate such that the height difference between the first drive pins and the display panel body, caused because the first drive pins are lifted up, is compensated, playing a role of balancing by supporting the drive chip. It is avoided the occurrence of poor electrical conduction of the conductive particles, and it is ensured that the drive chip can be bonded to the display panel body normally.

DESCRIPTION OF DRAWINGS

For explaining the technical solutions used in the embodiments of the present application more clearly, the appended figures to be used in describing the embodiments will be briefly introduced in the following. Obviously, the appended figures described below are only some of the embodiments of the present application, and those of ordinary skill in the art can further obtain other figures according to these figures without making any inventive effort.

REFERENCE NUMBERS

Figure 1:
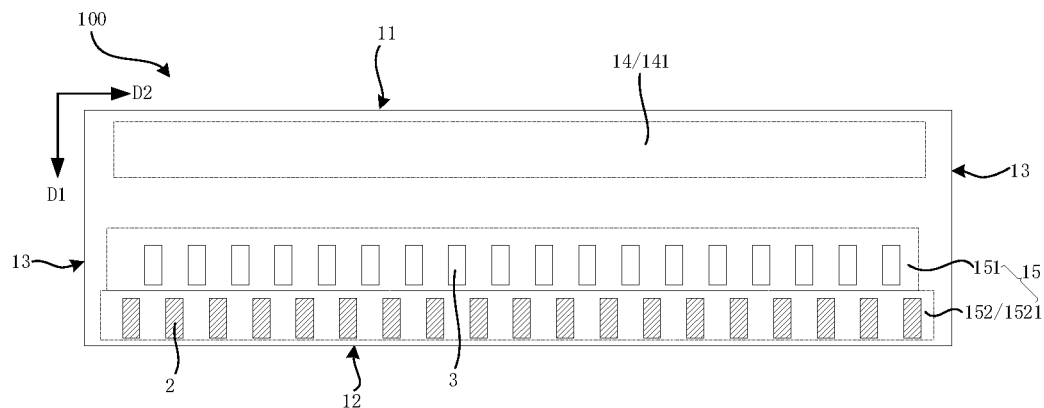
FIG. 1 is a schematic diagram illustrating a first type of planar structure of a drive chip provided in an embodiment of the present application.

100: drive chip; 11: first edge; 12: second edge; 13: third edge; 14: first area; 141: empty area; 1411: sub empty area; 142: dummy pin area; 15: second area; 151: first sub area; 152: second sub area; 1521: peripheral pin area; 1521a: first peripheral pin area; 1521b: second peripheral pin area; 1522: central pin area;
1: substrate; 2: first drive pin; 3: second drive pin; 4: dummy pin;
200: display panel body; 201: display area; 202: bonding area; 203: non-display area; 204: fanout area; 201: first bonding pad; 22: second bonding pad;
300: conductive particle.

DESCRIPTION OF EMBODIMENTS OF THE DISCLOSURE

The technical solutions in the embodiments of the present application are clearly and completely described below with reference to appending drawings of the embodiments of the present application. Obviously, the described embodiments are merely a part of embodiments of the present application and are not all of the embodiments. Based on the embodiments of the present application, all the other embodiments obtained by those of ordinary skill in the art without making any inventive effort are within the scope the present application. In addition, it should be understood that the specific embodiments described herein are merely for illustrating and interpreting the present application and the present application is not limited thereto. In the present application, direction words used herein, such as "upper" and "lower", generally refer to the upper and lower of a device under an actual use or operation state, as the directions shown in the drawings, unless otherwise specified; "inner" and "outer" are for the contour of the device.

Figure 2A:
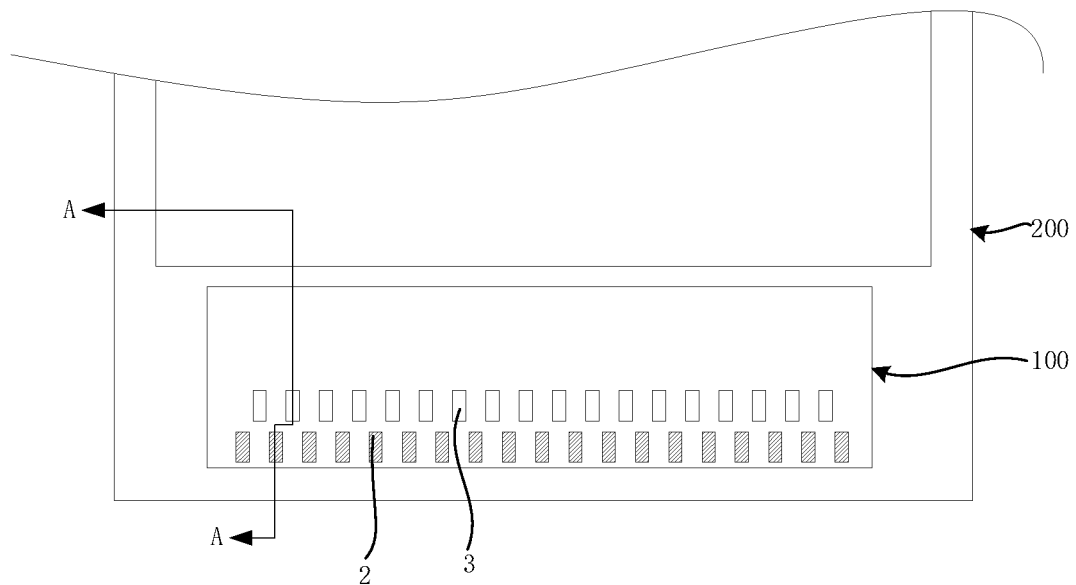
FIG. 2A is a schematic diagram illustrating a bonding structure of a drive chip and a display panel body provided in an embodiment of the present application.
Figure 2B:
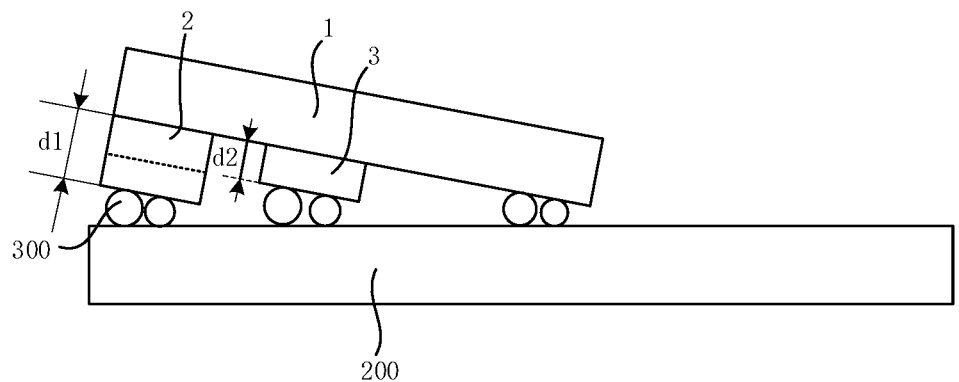
FIG. 2B is a schematic diagram illustrating a cross-section of the drive chip and the display panel body shown in FIG. 2A along an A-A line.

Please refer to FIG. 1, FIG. 2A to 2B. FIG. 1 is a schematic diagram illustrating a first type of planar structure of a drive chip provided in an embodiment of the present application. FIG. 2A is a schematic diagram illustrating a bonding structure of a drive chip and a display panel body provided in an embodiment of the present application. FIG. 2B is a schematic diagram illustrating a cross-section of the drive chip and the display panel body in FIG. 2A along an A-A line.

The embodiment of the present application provides a drive chip 100. The drive chip 100 includes a first area 14 and a second area 15. The drive chip 100 includes a substrate 1 and pins disposed on the substrate 1. The density of the pins located in the first area 14 is lower than the density of the pins located in the second area 15. The plurality of pins located in the second area 15 includes first drive pins 2 and second drive pins 3. The first drive pins 2 are located at a side of the second area 15 away from the first area 14.

Specifically, there is anisotropic conductive adhesive disposed between the pins and the display panel body 200. A plurality of conductive particles are distributed among the anisotropic conductive adhesive. The pins and the display panel body 200 squeeze the conductive particles 300 such that electrical conduction is realized.

It can be understood that the density of the pins in the first area 14 is less than the density of the pins in the second area 15 such that the first drive pins 2 disposed in the first area 14 provides less support than the second drive pins 3 disposed in the second area 15. As such, the substrate 1 will incline toward the first area 14, causing the first drive pins 2 in the second area 15 to curl up such that the distance between the display panel body 200 and the face of the first drive pins 2 close to the display panel body 200 increases. As a result, the conductive particles 300 cannot be squeezed any longer to be deformed, and the first drive pins cannot be bonded to the display panel body 200. This causes poor electrical conduction for the first drive pins 2.

In view of this, in the embodiment of the present application, the distance d1 between the substrate 1 and the face of the first drive pins 2 away from the substrate 1 is greater than the distance d2 between the substrate 1 and the face of the second drive pins 3 away from the substrate 1. The distance is designed in a differentiated manner for the first drive pins 2 and the second drive pins 3. By this, the distance difference (d2−d1) between the two is used to compensate the height difference between the first drive pins and the display panel body 200, caused because the first drive pins 2 are curled up. Therefore, the conductive particles 300 between the first drive pins 2 and the display panel body 200 are made able to be squeezed to be deformed such that it is ensured that the drive chip 100 can be bonded to the display panel body 200 normally and it is avoided the occurrence of poor electrical conduction of the conductive particles 300.

It needs to be noted that specific location of the first area 14 and the second area on the drive chip 100 and specific location where the pins are disposed are not limited in the present application. The concepts proposed in this application is applicable to any situation associated with the "see-saw" effect in above descriptions.

Specifically, in an embodiment, the density of the pins of the first area 14 is 0, that is, the pins are disposed only in the second area 15, no pins are disposed in the first area 14, and the first drive pins 2 are located in the second area 15. In another embodiment, the density of the pins of the first area 14 is greater than 0, that is, the pins are disposed in both the first area 14 and the second area 15. The pins disposed in the first area 14 provide less support than the pins disposed in the second area 15, causing part of the pins disposed in the second area 15 to curl up. For example, the number of the pins disposed in the first area 14 is less than the number of the pins disposed in the second area 15. Of course, the invention is not limited to the cases enumerated in the embodiments of the present application, and other cases are not detailed herein.

To improve the layout and increase layout space, the embodiments of the present application are illustrated by taking an example of the pins disposed at a same side of the drive chip 100. Of course, the invention is not limited to the cases enumerated in the embodiments of the present application, and other cases are not detailed herein.

Please refer to FIG. 1 again. Specifically, the drive chip 100 includes a first edge 11 and a second edge 12 that are disposed opposite to each other, and two third edges 13 connecting the first edge 11 and the second edge 12. The first edge 11 and the second edge 12 are disposed in parallel. The two third edges 13 are disposed in parallel.

In the embodiment of the present application, a first direction D1 is defined as a direction from the first 14 to the second area 15, that is, the first direction D1 is a direction from the first edge 11 to the second edge 12. A second direction D2 is perpendicular to the first direction D1.

Specifically, the first area 14 at least includes an empty area 141. The second area 15 includes a first sub area 151 and a second sub area 152 sequentially arranged along the first direction D1. The second sub area 152 is disposed close to the second edge 12. The first sub area 151 is located between the first area 14 and the second sub area 152. The first drive pins 2 are located in the second sub area 152. The second drive pins 3 are at least located in the first sub area 151.

It can be understood that an area on the display panel body 200 corresponding to the empty area 141 is a layout area. Fanout wiring lines of the display panel body 200 are electrically connected to the first drive pins 2 and the second drive pins 3 via this layout area. As a result, the lower bezel of the display panel body 200 can be saved in space. It benefits an implementation of narrow bezel.

It needs to be noted that the location where the drive chip 100 curls up depends on the location of the empty area 141 and the position and layout of the first drive pins 2 and the second drive pins 3. The location where the drive chip 100 of the present application will be described in detail with reference to specific embodiments.

Figure 3A:
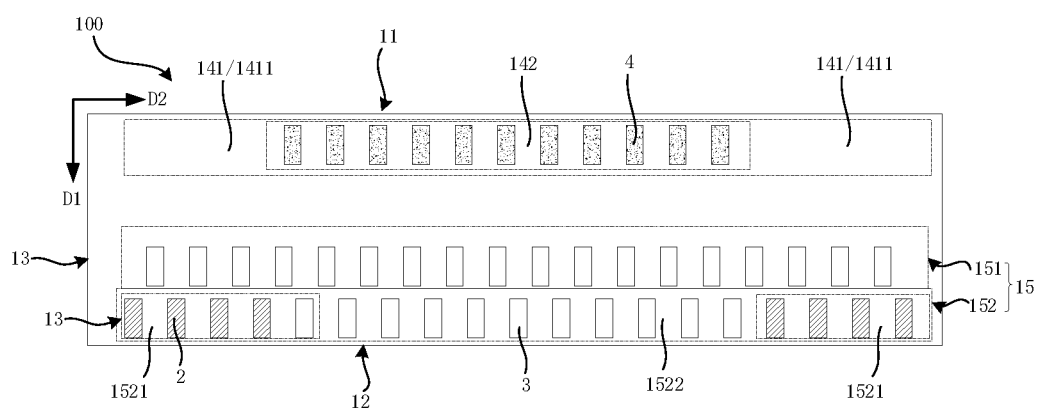
FIG. 3A is a schematic diagram illustrating a second type of planar structure of a drive chip provided in an embodiment of the present application.

FIG. 3A is a schematic diagram illustrating a second type of planar structure of a drive chip provided in an embodiment of the present application. The differences between FIG. 3A and FIG. 1 are that the first area 14 further includes a dummy pin area 142, the dummy pin area 142 extends along the second direction D2, and there are a plurality of dummy pins 4 disposed in the dummy pin area 142.

It can be understood that both the first drive pins 2 and the second drive pins 3 will transmit electrical signals but the dummy pins 4 only play a role of support function and will not transmit electrical signals. When the drive chip 100 is bonded to the display panel body 200, the dummy pins 4 and dummy pads on the display panel body 200 are connected in a one-to-one correspondence such that the second drive pins 3 in the second sub area 152 corresponding to the dummy pin area 142 are connected to pads on the display panel body 200 without the occurrence of curling up. Because the dummy pins 4 are not disposed in the empty area 141, the first drive pins 2 in the second sub area 152 corresponding to the empty area 141 cannot be connected to pads on the display panel body 200 in a one-to-one correspondence, resulting in the occurrence of curling up.

Specifically, the empty area 141 includes two sub empty areas 1411. The two sub empty areas 1411 are located at two opposite ends of the dummy pin area 142, respectively. The two sub empty areas 1411 are close to the two third edges 13, respectively. The second sub area 152 includes a central pin area 1522 and two peripheral pin areas 1521 that are arranged along the second direction D2. The two peripheral pin areas 1521 are located at two opposite ends of the central pin area 1522, respectively. The two peripheral pin areas 1521 are close to the two third edges 13, respectively. The first drive pins 2 are located in the peripheral pin areas 1521. The second drive pins 3 are located in the first sub area 151 and the central pin area 1522, that is, the location where the drive chip 100 is curled up is in the peripheral pin areas 1521.

In the present embodiment, the first drive pins 2 in each of the peripheral pin areas 1521 are arranged in a single row. Specifically, the first drive pins 2 in the peripheral pin areas are arranged along the second direction D2 in a single row. The first drive pins 2 and the second drive pins 3 in the central pin area 1522 are arranged along the second edge 12. The first drive pins 2 and the second drive pins 3 in the central pin area 1522 are arranged in a same way. The first drive pins 2 and the second drive pins 3 are placed vertically.

It can be understood that in a direction from a location close to the central pin area 1522 to a location away from the central pin area 1522, the more the first drive pins 2 are distanced from the dummy pins 4, the higher the first drive pins 2 lift up. In the present application, in the aspect of arrangement in horizontal direction, the distance is designed in a differentiated way for the first drive pins 2 such that the distance between the substrate 1 and the face of the first drive pins 2 away from the substrate 1 increases along a direction from a location close to the central pin area 1522 to a location away from the central pin area 1522, thereby overcoming afore-mentioned drawbacks.

Figure 3B:
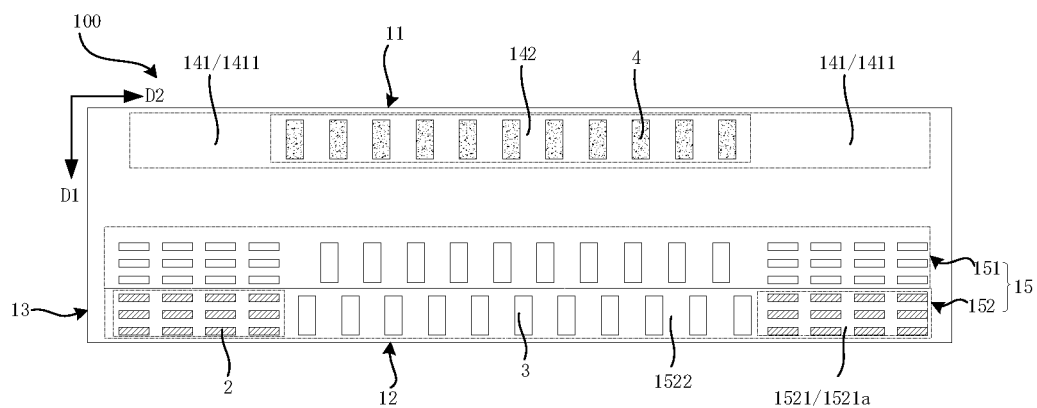
FIG. 3B is a schematic diagram illustrating a third type of planar structure of a drive chip provided in an embodiment of the present application.

Please refer to FIG. 3B for an embodiment of the present application. FIG. 3B is a schematic diagram illustrating a third type of planar structure of a drive chip provided in an embodiment of the present application. The differences between FIG. 3B and FIG. 3A are that the peripheral pin area 1521 includes a first peripheral pin area 1521a, the first drive pins 2 in the first peripheral pin area 1521a are arranged in at least two rows, each row of the first drive pins 2 includes at least two first drive pins disposed in parallel, wherein the distance between the substrate 1 and the face of the first drive pins 2 in the first peripheral pin area 1521a away from the substrate 1 increases along the first direction D1.

Specifically, the first drive pins 2 in the first peripheral pin area 1521a are arranged along the second direction D2 in at least two columns. The fanout wiring lines may be electrically connected to the first drive pins 2 at an end close to the third edge 13 from a side face of the first peripheral pin area 1521a such that layout space is saved. It helps reduce the lower bezel of the display panel body 200 in a further step.

In order to clearly illustrate the solution of the present embodiment, an example of three rows of the first drive pins in the first peripheral pin area 1521a is taken below for simplicity.

Along the first direction D1, the first drive pins 2 are classified into a first row, a second row and a third row in order. The first drive pins 2 are placed horizontally and the second drive pins 3 are placed vertically. It can be understood that the first row of the first drive pins 2 is the nearest to the dummy pins 4, and the lifted height is the smallest; the third row of the first drive pins 2 is the farthest from the dummy pins 4, and the lifted height is the largest; the distance from the second row of the first drive pins 2 to the dummy pins 4 is between that of the first row of the first drive pins 2 and that of the second row of the first drive pins 2, and the lifted height is also between that of the first row of the first drive pins 2 and the second row of the first drive pins 2.

Base on this, the present embodiment utilizes a relation, the distance between the substrate 1 and the face of the first row of the first drive pins 2 away from the substrate 1<the distance between the substrate 1 and the face of the second row of the first drive pins 2 away from the substrate 1<the distance between the substrate 1 and the face of the third row of the first drive pins 2 away from the substrate 1, that is, a design of gradually increasing along the first direction D1 is adopted for the distance between the substrate 1 and the face of rows of the first drive pins 2 away from the substrate 1 for overcoming the afore-mentioned drawbacks.

Further, the distance d1 between the substrate 1 and the face of the first drive pins 2 in the first peripheral pin area 1521a away from the substrate 1 increases along a direction from a location close to the central pin area 1522 to a location away from the central pin area 1522 for being adaptive to the first drive pins 2 with different degrees of curling up along the horizontal direction (i.e., the second direction D2).

Figure 3C:
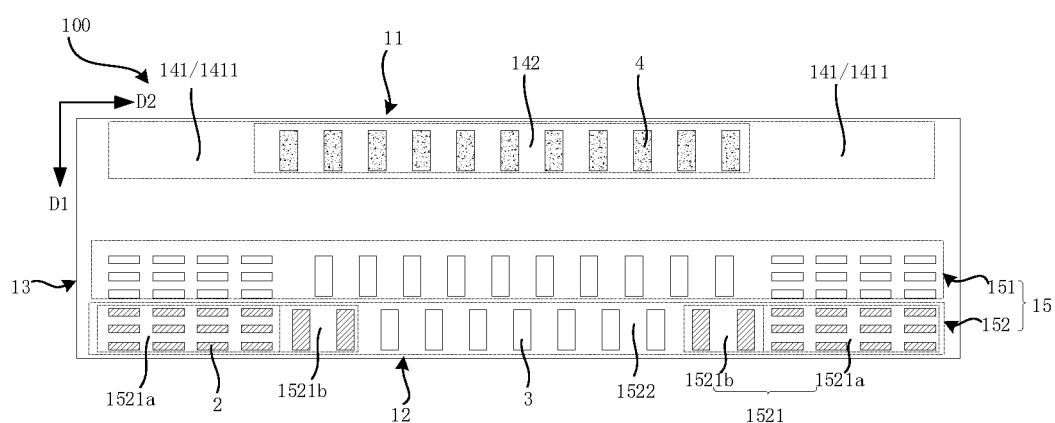
FIG. 3C is a schematic diagram illustrating a fourth type of planar structure of a drive chip provided in an embodiment of the present application.

Please refer to FIG. 3C for an embodiment of the present application. FIG. 3C is a schematic diagram illustrating a fourth type of planar structure of a drive chip provided in an embodiment of the present application. The differences between FIG. 3C and FIG. 3B are that an arrangement of "single row plus multiple rows" is adopted for the first drive pins 2 in the present embodiment in order to ensure that all the lifted first drive pins 2 can be bonded to the display panel body 200.

Specifically, the peripheral pin area 1521 further includes a second peripheral pin area 1521b. The second peripheral pin area 1521b is located between the first peripheral pin area 1521a and the central pin area 1522. The first drive pins 2 in the second peripheral pin area 1521b are arranged along the second direction D2 in a single row. The distance between the substrate 1 and the face of the first drive pins 2 in the second peripheral pin area 1521b away from the substrate 1 increases along a direction from a location close to the central pin area 1522 to a location away from the central pin area 1522.

Figure 3D:
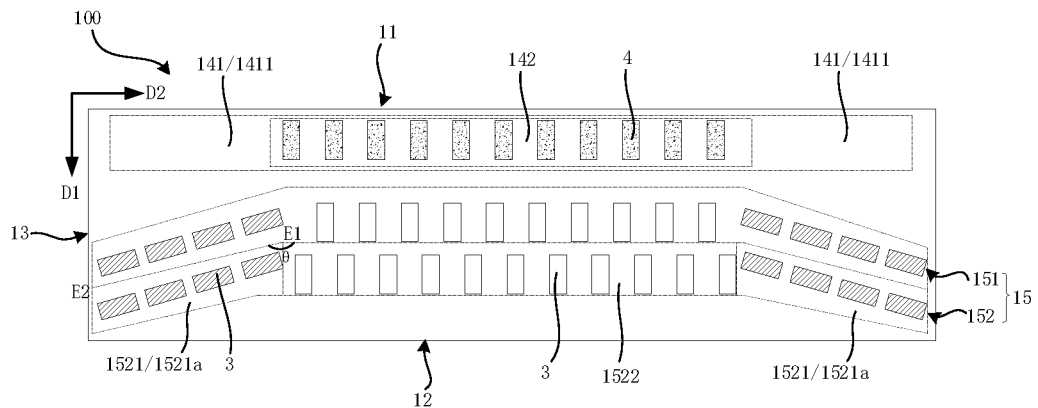
FIG. 3D is a schematic diagram illustrating a fifth type of planar structure of a drive chip provided in an embodiment of the present application.

Please refer to FIG. 3D for an embodiment of the present application. FIG. 3D is a schematic diagram illustrating a fifth type of planar structure of a drive chip provided in an embodiment of the present application. The differences between FIG. 3D and FIG. 3A are that the peripheral pin area 1521 is inclined with respect to the central pin area 1522, each of the peripheral pin areas 1521 includes a first end E1 connecting to the central pin area 1522 and a second end E2 away from the central pin area 1522, and the distance from the first end E1 to the first area 14 is less than the distance from the second end E2 to the first area 14.

Specifically, the distance from the first end E1 to the first edge 11 is less than the distance from the second end E2 to the first edge 11; on the second direction D2, an included angle formed between connection lines between the first end E1 and the second end E2 of the peripheral pin areas 1521 is an obtuse angle.

In the present embodiment, the first drive pins 2 in the peripheral pin areas 1521 may also adopt the "single-row" arrangement. A part of each fanout wiring line may extend to a bonding area of the display panel body 200 corresponding to the second area such that a part of a fanout area of the display panel body 200 overlaps with the bonding area. In this way, a decrease of the lower bezel of the display panel body 200 can be realized, thereby realizing an extra narrow bezel design on the promise that high resolution pursued in the market is satisfied and the performance of the drive chip 100 is not lowered.

Figure 3E:
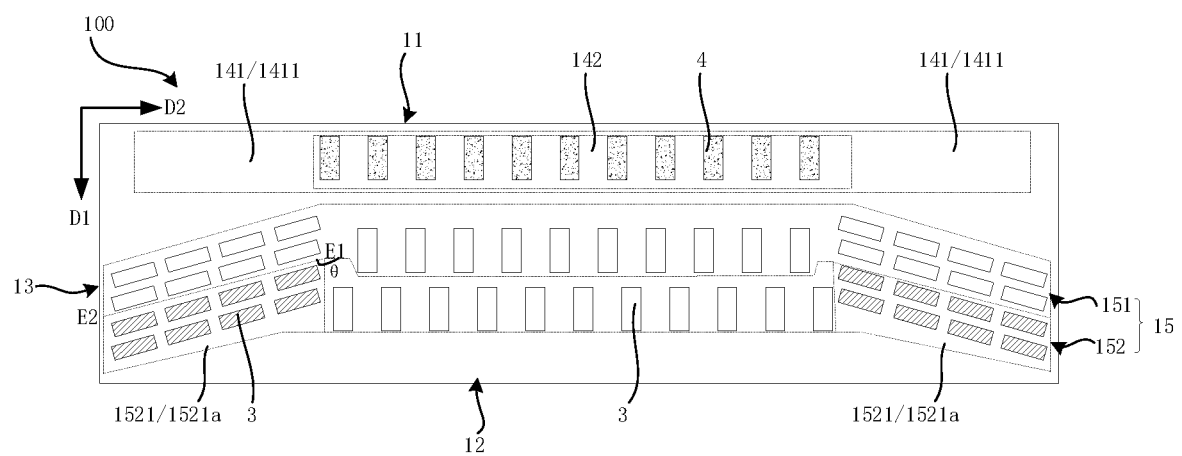
FIG. 3E is a schematic diagram illustrating a sixth type of planar structure of a drive chip provided in an embodiment of the present application.

Please refer to FIG. 3E for an embodiment of the present application. FIG. 3E is a schematic diagram illustrating a sixth type of planar structure of a drive chip provided in an embodiment of the present application. The differences between FIG. 3E and FIG. 3D are that in the present embodiment, the "multiple-row" arrangement is adopted for the first drive pins 2 in the peripheral pin area 1521. Details of the distance between the substrate 1 and the face of the first drive pins 2 in the multiple-row arrangement away from the substrate 1 may be referred to that for the first drive pins 2 in the multiple-row arrangement in the afore-described embodiments shown in FIG. 4B, which are not repeated herein.

Please refer to FIG. 1 for an embodiment of the present application. The differences between FIG. 1 and FIG. 3A are that the empty area 141 occupies the whole first area 14, the first drive pins 2 are located in the whole second sub area 152, and the second drive pins 3 are located in the first sub area 151. That is, in this situation, the location where the drive chip is curled up is the whole second sub area 152.

Specifically, since no dummy pins 4 are disposed in the first area 14, all the pins in the second sub area 152 will lift up. All the pins in the second sub area 152 are the second drive pins 3. The distance d1 between the substrate 1 and the face of the first drive pins 2 away from the substrate 1 is greater than the distance d2 between the substrate 1 and the face of the second dummy pins 3 away from the substrate 1 for overcoming the drawback of curling-up of the second drive pins 3.

Figure 4A:
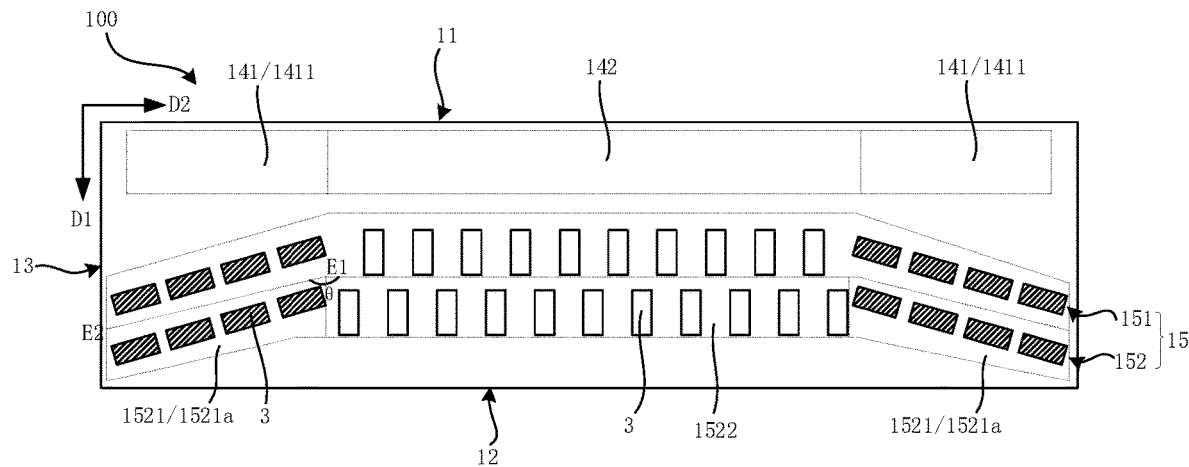
FIG. 4A is a schematic diagram illustrating a seventh type of planar structure of a drive chip provided in an embodiment of the present application.

Please refer to FIG. 4A for an embodiment of the present application. FIG. 4A is a schematic diagram illustrating a seventh type of planar structure of a drive chip provided in an embodiment of the present application. The differences between the FIG. 4A and FIG. 3D are that the empty area 141 is the whole first area 14, the second sub area 152 includes the central pin area 1522 and the two peripheral pin areas 1521 that are arranged along the second direction D2, the two peripheral pin areas 1521 are located at two opposite sides of the central pin area 1522, respectively, the first drive pins 2 are located in the peripheral pin areas 1521, the second drive pins 3 are located in the first sub area 151 and the central pin area 1522, that is, the location where the drive chip 100 is curled up is in the peripheral pin areas 1521.

Each of the peripheral pin areas 1521 is inclined with respect to the central pin area 1522, each of the peripheral pin areas 1521 includes a first end E1 connecting to the central pin area 1522 and a second end E2 away from the central pin area 1522, and the distance from the first end E1 to the first area 14 is less than the distance from the second end E2 to the first area 14.

Specifically, the distance from the first end E1 to the first edge 11 is less than the distance from the second end E2 to the first edge 11; on the second direction D2, an included angle formed between connection lines between the first end E1 and the second end E2 of the peripheral pin areas 1521 is an obtuse angle.

In the present embodiment, the first drive pins 2 in the peripheral pin area 1521 are arranged from the first end E1 to the second end E2 in a single row. The distance d1 between the substrate 1 and the face of the first drive pins 2 away from the substrate 1 increases along a direction from a location close to the central pin area 1522 to a location away from the central pin area 1522.

It can be understood that in the present embodiment, no dummy pins 4 are disposed in the first area 14; however, the first drive pins 2 are inclined, and the second drive pins 3 in the second sub area 152 are disposed in a middle of the drive chip 100. Therefore, the second drive pins 3 in the second sub area 152 will not lift up. Only the first drive pins 2 will lift up. In the present application, in the direction along the connection line between the first end E1 and the second end E2, the distance is designed in a differentiated way for the first drive pins 2 such that it is adaptive to different degrees of curling-up along the direction of connection line for the first drive pins 2.

Figure 4B:
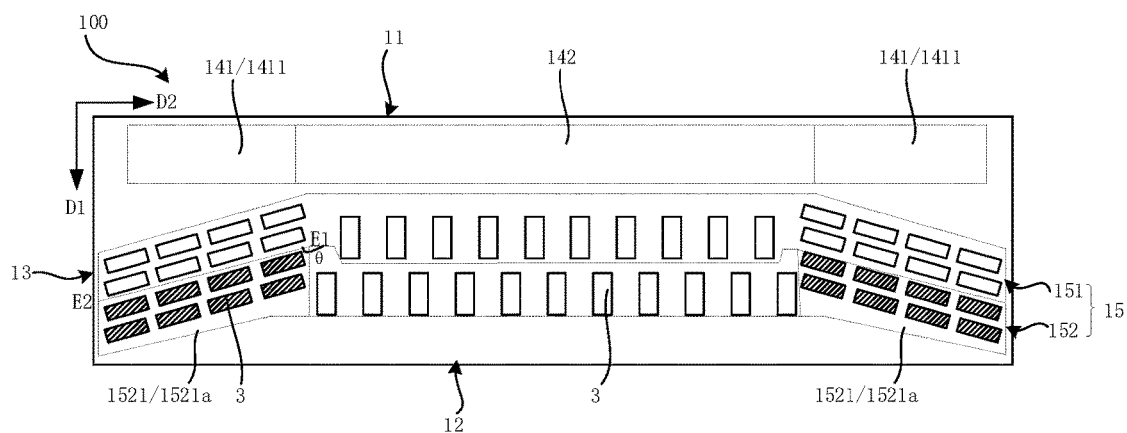
FIG. 4B is a schematic diagram illustrating an eighth type of planar structure of a drive chip provided in an embodiment of the present application.

Please refer to FIG. 4B for an embodiment of the present application. FIG. 4B is a schematic diagram illustrating an eighth type of planar structure of a drive chip provided in an embodiment of the present application. The differences between FIG. 4B and FIG. 4A are that the first drive pins in the peripheral pin area 1521 are arranged in at least two rows, each row of the first drive pins 2 includes at least two first drive pins disposed in parallel; the distance between the substrate 1 and the face of the first drive pins 2 in the peripheral pin area 1521 away from the substrate 1 increases along the first direction D1. In the present application, a design of gradually increasing is adopted for the distance between the substrate 1 and the face of rows of the first drive pins 2 away from the substrate 1 for being adaptive to different degrees of curling-up along the first direction D1 for the first drive pins 2.

Further, the distance d1 between the substrate 1 and the face of each row of the first drive pins 2 in the peripheral pin area 1521 away from the substrate 1 increases along a direction from a location close to the central pin area 1522 to a location away from the central pin area 1522 for being adaptive to different degrees of curling-up along the direction of connection line for each row of the first drive pins 2.

Referring to FIGS. 1, 3A to 3E and 4A to 4B, the first drive pins 2 and the second drive pins 3 in the second sub area 152 and the second drive pins 3 in the first sub area 151 are interlaced with each other for optimizing the layout space.

It needs to be noted that in the present application, the distance d1 between the substrate 1 and the face of the first drive pins 2 away from the substrate 1 is greater than the distance between the substrate 1 and the face of the second drive pins 3 away from the substrate 1, and more specifically, the thickness of the first drive pins 2 is greater than the thickness of the second drive pins 3.

Specifically, the difference between the thickness of the first drive pins 2 and the thickness of the second drive pins 3 is greater than or equal to 0.1 micrometer.

Figure 5:
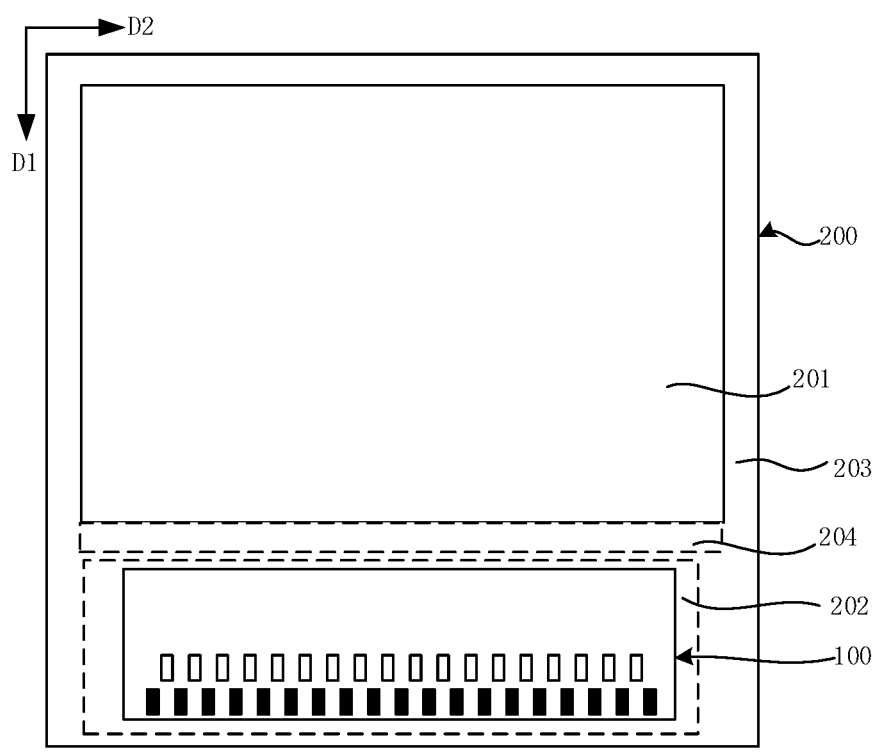
FIG. 5 is a schematic diagram illustrating the planar structure of a display panel provided in an embodiment of the present application.

FIG. 5 is a schematic diagram illustrating the planar structure of a display panel provided in an embodiment of the present application. The embodiment of the present application further provides a display panel. The display panel includes a display panel body 200 and the drive chip 100 of the afore-described embodiment. The display panel body 200 includes a display area 201 and a bonding area 202 located at a side of the display area 201. The drive chip 100 is disposed in the bonding area 202. The bonding area 202 includes a plurality of first bonding pads and a plurality of second bonding pads. The first bonding pads are electrically connected to the first drive pins 2, and the second bonding pads are electrically connected to the second drive pins 3.

Specifically, the display panel body 200 further includes a non-display area 203. The non-display area 203 surrounds the display area 201. The bonding area 202 is located in the non-display area 203. At least one set of GOA (gate driving circuit) wiring lines are disposed in the non-display area 203. The GOA wiring lines are illustrated by two sets of symmetrical GOA wiring lines, for example. Each of the two sets of the GOA wiring lines includes a parallel segment located outside of the display area 201 and located parallel to an edge of the display area 201, and an inclined segment located in the non-display area 203 and pointing to the drive chip 100. The inclined segment of the GOA wiring lines connects to the drive chip 100 for inputting scan signals, and the parallel segment of the GOA wiring lines connects to scan lines of pixel rows for outputting the scan signals.

The display area 201 includes a plurality of signal lines extending along the first direction D1 and arranged along the second direction D2. For example, the signal lines may include data signal lines for transmitting data signals, or may include other signal lines known in the existing arts, such as touch control signal lines. They are not limited in the embodiments of the present application. The non-display area 203 includes a fanout area 204. The fanout area 204 is located between the display area 201 and the bonding area 202. A plurality of wiring lines are disposed in the fanout area 204. One end of the fanout wiring lines is electrically connected to corresponding signal lines, and the other end of the fanout wiring lines is electrically connected to the first bonding pads and the second bonding pads. In such a way, the display panel body 200 is electrically connected to the drive chip 100 such that the drive chip 100 can propagate signals to the signal lines.

Specifically, the display panel body 200 may be a liquid crystal display panel. The display panel body 200 may also be an organic light-emitting diode display panel. Specifically, the display panel body 200 is a fringe field switching (FFS) liquid crystal display panel. It can be understood that the display panel body 200 may also be an in-plane switching (IP) liquid crystal display panel or a vertical alignment liquid crystal display panel.

Please refer to FIG. 5 and FIG. 2B. The embodiment of the present application further provides a display panel. The display panel includes the display panel body 200 and the drive chip 100. The display panel body 200 includes the display area 201 and the bonding area 202 located at a side of the display area 201. The drive chip 100 is located in the bonding area 202. The drive chip 100 includes the substrate 1 and the first drive pins 2 and the second drive pins 3 disposed on the substrate 1. Both the first drive pins 2 and the second drive pins 3 are electrically connected to the display panel body 200.

The drive chip 100 is in a lifted-up state. The distance between the substrate 1 and the face of the first drive pins 2 away from the substrate 1 is greater than the distance between the substrate 1 and the face of the second drive pins 3 away from the substrate 1 such that the height difference between the first drive pins 2 and the display panel body 200, caused from the lifted first drive pins 2, is compensated, playing a role of balancing by supporting the drive chip 100. It is avoided the occurrence of poor electrical conduction of the conductive particles 300, and it is ensured that the drive chip 100 can be bonded to the display panel body 200 normally.

The beneficial effects are described as follows. In the drive chip and the display panel provided in the present application, the distance between the substrate and the face of the pins on the drive chip away from the substrate is designed in a differentiated manner. The distance between the substrate and the face of the lifted-up first drive pins away from the substrate is greater than the distance between the substrate and the face of the non-lifted-up second drive pins away from the substrate such that the height difference between the first drive pins and the display panel body, caused because the first drive pins are lifted up, is compensated, playing a role of balancing by supporting the drive chip. It is avoided the occurrence of poor electrical conduction of the conductive particles, and it is ensured that the drive chip can be bonded to the display panel body normally.

While the preferred embodiments of the present application have been illustrated and described in detail, various modifications and alterations can be made by persons skilled in this art. The embodiment of the present application is therefore described in an illustrative but not restrictive sense. It is intended that the present application should not be limited to the particular forms as illustrated, and that all modifications and alterations which maintain the spirit and realm of the present application are within the scope as defined in the appended claims.

The invention claimed is:

1. A drive chip, having a first area and a second area; the drive chip comprising a substrate and a plurality of pins disposed on the substrate, a density of ones of the pins located in the first area is lower than a density of ones of the pins located in the second area, the ones of the pins located in the second area comprise a plurality of first drive pins and a plurality of second drive pins, and the first drive pins are located at a side of the second area away from the first area;

wherein a distance between the substrate and a surface of each of the first drive pins away from the substrate is greater than a distance between the substrate and a surface of each of the second drive pins away from the substrate, the first area at least comprises an empty area, the second area comprises a first sub area and a second sub area arranged along a first direction, and the first sub area is located between the first area and the second sub area, the first drive pins are located in the second sub area, the second drive pins are located at least in the first sub area, and the first direction is a direction from the first area to the second area, the first area further comprises a dummy pin area in which a plurality of dummy pins are provided; the empty area comprises two empty sub areas located respectively at opposite sides of the dummy pin area, and the two empty sub areas and the dummy pin area are arranged along a second direction perpendicular to the first direction, and the second sub area comprises a central pin area and two peripheral pin areas that are arranged along the second direction, the two peripheral pin areas are located at opposite sides of the central pin area, respectively, the first drive pins are located in the peripheral pin areas, and the second drive pins are located in the first sub area and the central pin area.

2. The drive chip of claim 1, wherein ones of the first drive pins in each of the peripheral pin areas are arranged in a single row, the distance between the substrate and the surface of the each of the first drive pins away from the substrate increases along a direction from a location close to the central pin area to a location away from the central pin area.

3. The drive chip of claim 2, wherein each of the peripheral pin areas is inclined with respect to the central pin area, each of the peripheral pin areas comprises a first end connected to the central pin area and a second end away from the central pin area, and a distance from the first end to the first area is less than a distance from the second end to the first area; and a connection line between the first end and the second end has an obtuse angle with respect to the second direction.

4. The drive chip of claim 1, wherein each of the peripheral pin areas comprises a first peripheral pin area, ones of the first drive pins in the first peripheral pin area are arranged in at least two rows each comprising at least two of the first drive pins disposed in parallel; and a distance between the substrate and a surface of each of the ones of the first drive pins in the first peripheral pin area away from the substrate increases along the first direction.

5. The drive chip of claim 4, wherein the distance between the substrate and the surface of the each of the ones of the first drive pins in the first peripheral pin area away from the substrate increases along a direction from a location close to the central pin area to a location away from the central pin area.

6. The drive chip of claim 5, wherein each of the peripheral pin areas further comprises a second peripheral pin area located between the first peripheral pin area and the central pin area, and ones of the first drive pins in the second peripheral pin area are arranged in a single row along the second direction; and a distance between the substrate and a surface of each of the ones of the first drive pins in the second peripheral pin area away from the substrate increases along the direction from the location close to the central pin area to the location away from the central pin area.

7. The drive chip of claim 1, wherein the empty area occupies a whole of the first area, the first drive pins are located in a whole of the second sub area, the second drive pins are located in the first sub area.

8. The drive chip of claim 1, wherein the empty area occupies a whole of the first area, the second sub area comprises a central pin area and two peripheral pin areas that are arranged along the second direction, the two peripheral pin areas are located at opposite sides of the central pin area, respectively, the first drive pins are located in the peripheral pin areas, and the second drive pins are located in the first sub area and the central pin area; and each of the peripheral pin areas is inclined with respect to the central pin area, each of the peripheral pin areas comprises a first end connected to the central pin area and a second end away from the central pin area, a distance from the first end to the first area is less than a distance from the second end to the first area; and a connection line between the first end and the second end has an obtuse angle with respect to the second direction.

9. The drive chip of claim 8, wherein ones of the first drive pins in each of the peripheral pin areas are arranged from the first end to the second end in a single row, and a distance between the substrate and a surface of each of the ones of the first drive pins in each of the peripheral pin areas away from the substrate increases along a direction from a location close to the central pin area to a location away from the central pin area.

10. The drive chip of claim 8, wherein ones of the first drive pins in each of the peripheral pin areas are arranged in at least two rows each comprising at least two of the first drive pins disposed in parallel; and
   a distance between the substrate and the surface of each of the ones of the first drive pins in each of the peripheral pin areas away from the substrate increases along the first direction.

11. The drive chip of claim 9, wherein the distance between the substrate and a surface of each of each row of the ones of the first drive pins in the each of the peripheral pin areas away from the substrate increases along a direction from a location close to the central pin area to a location away from the central pin area.

12. The drive chip of claim 1, wherein each of the first drive pins has a first thickness, each of the second drive pins has a second thickness, and the first thickness is greater than the second thickness.

13. The drive chip of claim 12, wherein a difference between the first thickness and the second thickness is greater than or equal to 0.1 micrometer.

14. A display panel, comprising a display panel body and a drive chip, wherein the drive chip has a first area and a second area and comprises a substrate and a plurality of pins disposed on the substrate, a density of ones of the pins located in the first area is lower than a density of ones of the pins located in the second area, the ones of the pins located in the second area comprise a plurality of first drive pins and a plurality of second drive pins, the first drive pins are located at a side of the second area away from the first area, and a distance between the substrate and a surface of each of the first drive pins away from the substrate is greater than a distance between the substrate and a surface of each of the second drive pins away from the substrate;
   wherein the display panel body comprises a display area and a bonding area located at a side of the display area, the drive chip is disposed in the bonding area; the bonding area comprises a plurality of first bonding pads and a plurality of second bonding pads, the first bonding pads are electrically connected to the first drive pins, the second bonding pads are electrically connected to the second drive pins,
   the first area at least comprises an empty area, the second area comprises a first sub area and a second sub area arranged along a first direction, and the first sub area is located between the first area and the second sub area,
   the first drive pins are located in the second sub area, the second drive pins are located at least in the first sub area, and the first direction is a direction from the first area to the second area,
   the first area further comprises a dummy pin area in which a plurality of dummy pins are provided; the empty area comprises two empty sub areas located respectively at opposite sides of the dummy pin area, and the two empty sub areas and the dummy pin area are arranged along a second direction perpendicular to the first direction, and
   the second sub area comprises a central pin area and two peripheral pin areas that are arranged along the second direction, the two peripheral pin areas are located at opposite sides of the central pin area, respectively, the first drive pins are located in the peripheral pin areas, and the second drive pins are located in the first sub area and the central pin area.

15. The drive chip of claim 14, wherein ones of the first drive pins in each of the peripheral pin areas are arranged in a single row, the distance between the substrate and the surface of the each of the first drive pins away from the substrate increases along a direction from a location close to the central pin area to a location away from the central pin area.

16. A display panel, comprising:
   a display panel body, comprising a display area and a bonding area located at a side of the display area; and
   a drive chip which is located in the bonding area, has a first area and a second area, and comprises a substrate and a plurality of pins disposed on the substrate, wherein a density of ones of the pins located in the first area is lower than a density of ones of the pins located in the second area, the ones of the pins located in the second area comprise a plurality of first drive pins and a plurality of second drive pins, and the first drive pins are located at a side of the second area away from the first area, and the first drive pins and the second drive pins are electrically connected to the display panel body;
   wherein the drive chip is in a curled-up state, a distance between the substrate and a surface of each of the first drive pins away from the substrate is greater than a distance between the substrate and a surface of each of the second drive pins away from the substrate,
   the first area at least comprises an empty area, the second area comprises a first sub area and a second sub area arranged along a first direction, and the first sub area is located between the first area and the second sub area,
   the first drive pins are located in the second sub area, the second drive pins are located at least in the first sub area, and the first direction is a direction from the first area to the second area,
   the first area further comprises a dummy pin area in which a plurality of dummy pins are provided; the empty area comprises two empty sub areas located respectively at opposite sides of the dummy pin area, and the two empty sub areas and the dummy pin area are arranged along a second direction perpendicular to the first direction, and
   the second sub area comprises a central pin area and two peripheral pin areas that are arranged along the second direction, the two peripheral pin areas are located at opposite sides of the central pin area, respectively, the first drive pins are located in the peripheral pin areas, and the second drive pins are located in the first sub area and the central pin area.

* * * * *